(12) United States Patent
Lee

(10) Patent No.: US 7,503,821 B2
(45) Date of Patent: Mar. 17, 2009

(54) MOTHER GLASS AND METHOD OF FABRICATING ORGANIC ELECTRO LUMINESCENCE DISPLAY DEVICE USING THE SAME

(75) Inventor: Il Ho Lee, Gyeongsangbuk-do (KR)

(73) Assignee: LG Display Co., Ltd., Seoul (KR)

( * ) Notice: Subject to any disclaimer, the term of this patent is extended or adjusted under 35 U.S.C. 154(b) by 607 days.

(21) Appl. No.: 11/186,790

(22) Filed: Jul. 22, 2005

(65) Prior Publication Data

US 2006/0017373 A1 Jan. 26, 2006

(30) Foreign Application Priority Data

Jul. 23, 2004 (KR) .................. 10-2004-0057638
Jul. 23, 2004 (KR) .................. 10-2004-0057639

(51) Int. Cl.
*H01J 9/00* (2006.01)

(52) U.S. Cl. .................................................... 445/23

(58) Field of Classification Search ............ 445/23–25; 313/501–506
See application file for complete search history.

(56) References Cited

FOREIGN PATENT DOCUMENTS

KR 2002-0041212 A 6/2002

*Primary Examiner*—Joseph L Williams
(74) *Attorney, Agent, or Firm*—Birch, Stewart, Kolasch & Birch, LLP.

(57) ABSTRACT

A mother glass is disclosed. The mother glass includes a plurality of organic electro luminescence arrays having a scan pad and a data pad. The plurality of organic electro luminescence arrays are arranged in a matrix type. The mother glass also includes: a non-array area, arranged between the organic electro luminescence arrays and an edge area located at an exterior of the arrangement of the matrix; at least one positive shorting bar formed at the edge area; at least one negative shorting bar formed at the edge area; a first line formed at the non-array area to electrically connect the data pad to the positive shorting bar; and a second line formed at the non-array area to electrically connect the scan pad to the negative shorting bar.

8 Claims, 19 Drawing Sheets

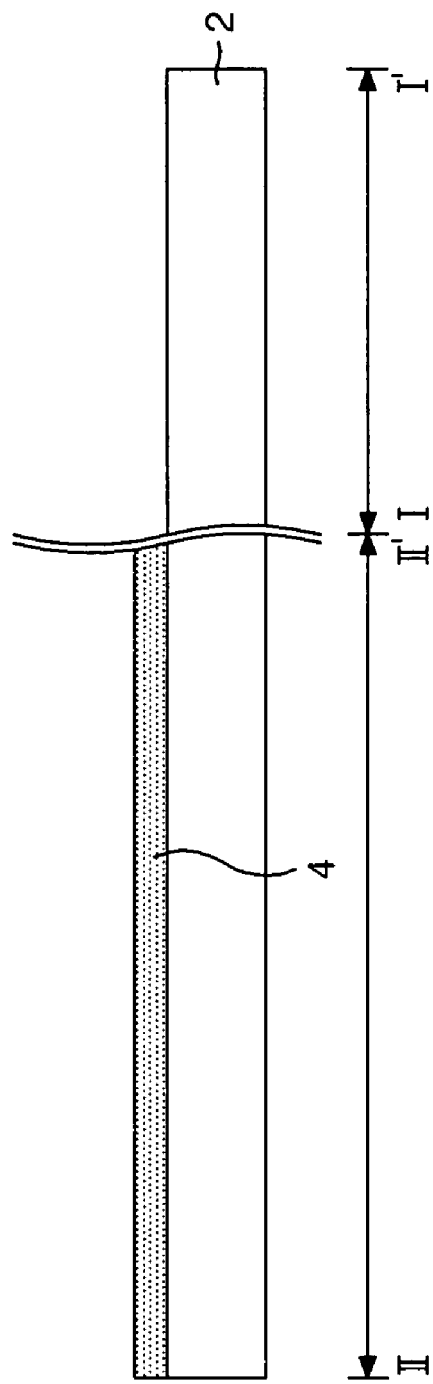

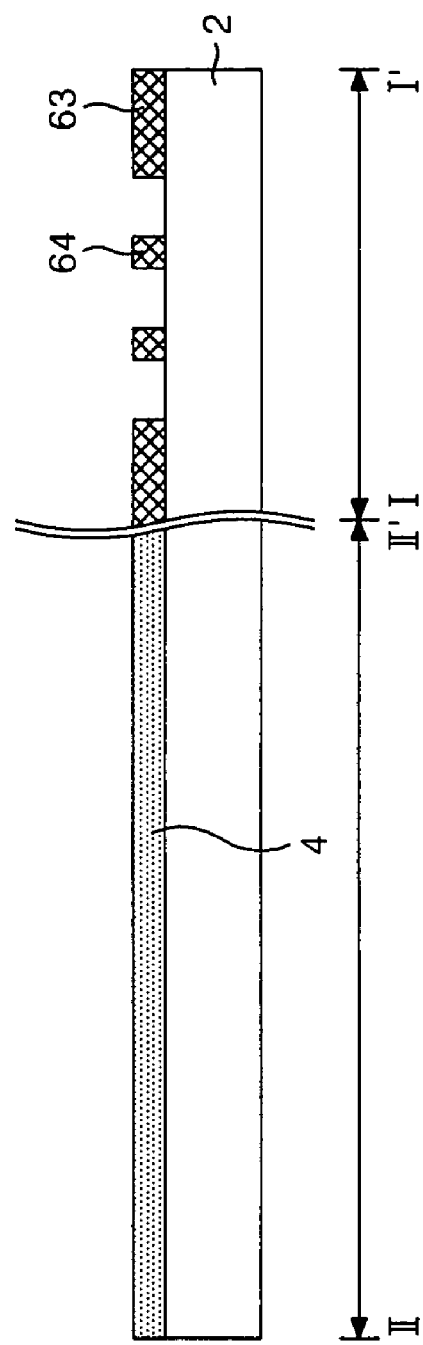

MOTHER GLASS AND METHOD OF FABRICATING ORGANIC ELECTRO LUMINESCENCE DISPLAY DEVICE USING THE SAME

This application claims the benefit of Korean Patent Applications No. P2004-57638 and P2004-57639 filed in Korea on Jul. 23, 2004, which are hereby incorporated by reference.

BACKGROUND OF THE INVENTION

1. Field of the Invention

The present invention relates to an organic electro luminescence display device, and more particularly, to a structure of positive and negative shorting bars of a mother glass and a method of fabricating an organic electro luminescence display device using the same.

2. Description of the Related Art

Recently, there have been developed various flat panel display devices reduced in weight and bulk that is capable of eliminating disadvantages of a cathode ray tube (CRT). Such flat panel display devices include a liquid crystal display (LCD), a field emission display (FED), a plasma display panel (PDP) and an electro-luminescence (EL) display, etc. Also, there have been actively processed studies for attempting to make a high display quality and a large-dimension screen of the flat panel display device.

In such flat panel display devices, the PDP has drawbacks in that it has been highlighted as the most advantageous display device to make a light weight, a small size and a large dimension screen because its structure and manufacturing process are simple, but it has low light-emission efficiency and large power consumption. On the other hand, the active matrix LCD employing a thin film transistor (TFT) as a switching device has drawbacks in that it is difficult to make a large dimension screen because a semiconductor process is used, and in that it has large power consumption due to a backlight unit and has a large light loss and a narrow viewing angle due to optical devices such as a polarizing filter, a prism sheet, a diffuser and the like.

Meanwhile, the EL device is largely classified into an inorganic electro-luminescence device and an organic electro-luminescence device depending upon a material of a light-emitting layer, and is a self-luminous device. When compared with the above-mentioned display devices, the EL device has advantages of a fast response speed, large light-emission efficiency, a large brightness and a large viewing angle. The inorganic electro-luminescence device has a larger power consumption than the organic electro-luminescence device, cannot obtain a higher brightness than the organic electro-luminescence device, cannot emit various colors of red(R), green(G) and blue(B). On the other hand, the organic electro-luminescence device is driven with a low direct current voltage of tens of volts, and has a fast response speed. Also, the organic electro-luminescence device can obtain a high brightness, and can emit various colors of red(R), green(G) and blue(B). Thus, the organic electro-luminescence device is suitable for a post-generation flat panel display device.

FIG. 1 is a sectional view illustrating an organic EL cell of a related art organic EL display device, and FIG. 2 is a diagram for explaining a light-emitting principle of the organic EL display device.

Referring to FIG. 1, an EL cell 3 includes: an organic light-emitting layer 10 provided between a first electrode (or an anode electrode) 4 and a second electrode (or a cathode electrode) 12. The organic light-emitting layer 10 includes an electron injection layer 10a, an electron carrier layer 10b, a light-emitting layer 10c, a hole carrier layer 10d and a hole injection layer 10e.

If a voltage is applied between the first electrode 4 and the second electrode 12, then electrons produced from the second electrode 12 are moved, via the electron injection layer 10a and the electron carrier layer 10b, into the light-emitting layer 10c. Further, holes produced from the first electrode 4 are moved, via the hole injection layer 10e and the hole carrier layer 10d, into the light-emitting layer 10c. Thus, electrons and holes fed from the electron carrier layer 10b and the hole carrier layer 10d, respectively, are collided with each other at the light-emitting layer to be recombined to generate a light. This light is emitted, via the first electrode 4, into the exterior to thereby display a picture.

FIG. 3 is a view showing an array area P1 and a non-array area P2 in the related art mother glass.

Referring to FIG. 3, an organic EL array including a plurality of EL cells is formed in the array area P1. The array area P1 includes a display area A where a picture is displayed upon an organic light emission and a non-display area B where data lines 54 and scan lines 55 area located, wherein the data lines 54 and the scan lines are extended from the organic EL array of the display area A. In the non-array area P2, a positive and negative shoring bar 53 used to an aging process and a lighting inspection, which are a stabilization process, and an aligning mark (not shown) used to a scribing process are formed.

The positive and negative shorting bar 53 is electrically connected to each of a data pad 56, connected to the data lines 54 of the non-display area B, and a scan pad 57, connected to the scan lines 55 of the non-display area B. Such a positive and negative shorting bar 53 is connected to a needle pin of inspecting equipment upon the aging process and the lighting inspection, to thereby transmit a voltage to the data pad 56 and the scan pad 57.

The non-array area P2 having he aligning mark(not shown) and the positive and negative shorting bar 53 is removed during the scribing process.

Such a positive and negative shorting bar 53 has a line width d1 more than about 2000 μm in order to contact with a needle pin of inspecting equipment, therefore, it becomes a fact to enlarge the non-array area P2 of the mother glass.

For instance, in a case that the organic EL array of ten lines is formed on the mother glass, the positive and negative shorting bar 53 occupy about 20 mm in the entire mother glass. If the area where the shorting bar occupies is large, then a rate of which the array area P1 of the mother glass occupies becomes smaller as mush as the area where the shorting bar occupies. Thus, a productivity of the organic EL display device becomes deteriorated.

In order to solve the above-mentioned problem, as shown in FIG. 4, a structure in which the positive and negative shorting bar 53 is reduced had been suggested.

The mother glass shown in FIG. 4 has an advantage capable of improving productivity. However, if a line width d2 of the positive and negative shorting bar 53 at the non-array area P1 is reduced, then a space, contacting with the needle pin of the inspecting equipment upon the aging process and the lighting inspection, becomes reduced to cause a case that the needle pin is contacted with the data pad 56 and the scan pad 57 of the array area P1, with not the positive and negative shorting bar 53.

Accordingly, a scratch is generated on the data pad 56 and the scan pad 57 due to the needle pin, so that the EL cell directly connected to the data pad 56 or the scan pad 57, in which the scratch is generated, and an EL cell connected to the data pad 56 or the scan pad 57, in which the scratch is not generated, have a brightness difference from each other.

In addition, each shorting bar 53 formed to be corresponded to each organic EL array is contacted with the needle pin, so that new inspecting equipment is needed to manufacture whenever an organic EL display device having another size is suggested. Accordingly, there is a problem that a fabricating cost of an organic EL display device becomes increased.

SUMMARY OF THE INVENTION

Accordingly, it is an object of the present invention to provide a mother glass capable of improving productivity by reducing a non-array area of a mother glass and of reducing a fabricating cost without manufacturing separate inspecting equipment.

It is another object of the present invention to provide a method of fabricating an organic EL display device using the mother glass.

In order to achieve these and other objects of the invention, a mother glass including a plurality of organic electro luminescence arrays having a scan pad and a data pad, wherein the plurality of organic electro luminescence arrays are arranged in a matrix type, according to an embodiment of the present invention includes: a non-array area, arranged between the organic electro luminescence arrays arranged in the matrix type, and an edge area located at an exterior of the arrangement of the matrix; at least more than one positive shorting bar formed at the edge area to supply with a positive voltage; at least more than one negative shorting bar formed at the edge area to supply with a negative voltage; a first line formed at the non-array area to electrically connect the data pad, formed in each of organic electro luminescence arrays, to the positive shorting bar; and a second line formed at the non-array area to electrically connect the scan pad, formed in each of organic electro luminescence arrays, to the negative shorting bar.

The mother glass further includes: a first common line connected to the first line and commonly connected to each data pad; and a second common line connected to the second line and commonly connected to each scan pad.

The mother glass further includes a dummy insulating film formed at a cross both the first line and the second line to electrically insulate the first line from the second line.

The mother glass further includes a first metal pattern formed on the dummy insulating film to electrically connect any one of the fist line and the second line.

The first and the second lines have a line width of 40 μm to 60 μm.

The first and the second common lines have a line width of 90 μm to 110 μm.

The positive shorting bar and the negative shorting bar are formed at left and right sides of the edge area of the mother glass, the negative shorting bar formed the left side of the edge area applies the negative voltage to a left side scan pad of the organic electro luminescence arrays, and the negative shorting bar formed the right side of the edge area applies the negative voltage to a right side scan pad of the organic electro luminescence arrays.

The positive shorting bar and the negative shorting bar are respectively formed at upward and downward and left and right of the edge area of the mother glass.

The negative shorting bar formed at upper left side of the edge area of the mother glass and the negative shoring bar formed at lower right side of the edge area of the mother glass supply the negative voltage to the left side scan pad of the organic electro luminescence arrays, and the negative shorting bar formed at upper right of the edge area of the mother glass and the negative shorting bar formed at lower left of the edge area of the mother glass supply the negative voltage to the right side scan pad of the organic electro luminescence arrays.

A mother glass including a plurality of organic electro luminescence arrays forming row and column and having a scan pad and data pad, and having a row direction non-array area arranged between the organic electro luminescence arrays of an adjacent row, a column direction non-array area arranged between the organic electro luminescence arrays of an adjacent column, a left column direction non-array area arranged at a left side of the organic electro luminescence arrays of the far left column and a right column direction non-array area arranged at a right side of the organic electro luminescence arrays of the far right column, according to an embodiment of the present invention includes: a plurality of positive shorting bars arranged in at least one area of the left non-array area and the right non-array area as many as the number of rows of the organic electro luminescence arrays to supply with a positive voltage; a plurality of negative shorting bars arranged in at least one area of the left non-array area and the right non-array area as many as the number of rows of the organic electro luminescence arrays to supply with a negative voltage; a plurality of first lines formed along the row direction non-array area located at an upper part of each row of the organic electro luminescence arrays to electrically connect the data pad, formed in each of the organic electro luminescence arrays, to the positive shorting bar; and a plurality of second lines formed along the row direction non-array area located at a lower part of each row of the organic electro luminescence arrays to electrically connect the scan pad, formed in each of the organic electro luminescence arrays, to the negative shorting bar.

The mother glass further includes: a first common line connected to the first line to be commonly connected to the data pad formed in each of the organic electro luminescence arrays of each row; and a second common line connected to the second line to be commonly connected to the scan pad formed in each of the organic electro luminescence arrays of each row.

A method of fabricating an organic electro luminescence display device, according to an embodiment of the present invention includes: providing a mother glass including a plurality of organic electro luminescence arrays having a scan pad and a data pad, wherein the plurality of organic electro luminescence arrays are arranged in a matrix type, a non-array area, arranged between the organic electro luminescence arrays arranged in the matrix type, and an edge area located at an exterior of the arrangement of the matrix; forming at least more than one positive shorting bar at the edge area to supply with a positive voltage, and forming at least more than one negative shorting bar at the edge area to supply with a negative voltage; and forming a first line at the non-array area to electrically connect the data pad, formed in each of organic electro luminescence arrays, to the positive shorting bar, and forming a second line at the non-array area to electrically connect the scan pad, formed in each of organic electro luminescence arrays, to the negative shorting bar.

The method further includes forming a first common line connected to the first line and commonly connected to each data pad, and a second common line connected to the second line and commonly connected to each scan pad.

The method further includes: forming a dummy insulating film at a cross both the first line and the second line to electrically insulate the first line from the second line; and forming a first metal pattern on the dummy insulating film to electrically connect any one of the fist line and the second line.

The organic electro luminescence array includes: a first electrode; an insulating film partially exposing the first electrode to define a light-emitting area; and a second electrode formed at the light-emitting area, and wherein the dummy insulating film is simultaneously formed of the same material as the insulating film and the first metal pattern is simultaneously formed of the same material as the second electrode.

A method of fabricating an organic electro luminescence display device, using a mother glass including a plurality of organic electro luminescence arrays forming row and column and having a scan pad and data pad, and having a row direction non-array area arranged between the organic electro luminescence arrays of an adjacent row, a column direction non-array area arranged between the organic electro luminescence arrays of an adjacent column, a left column direction non-array area arranged at a left side of the organic electro luminescence arrays of the far left column and a right column direction non-array area arranged at a right side of the organic electro luminescence arrays of the far right column, according to an embodiment of the present invention includes: forming a plurality of positive shorting bars in at least one area of the left non-array area and the right non-array area as many as the number of rows of the organic electro luminescence arrays to supply with a positive voltage; forming a plurality of negative shorting bars in at least one area of the left non-array area and the right non-array area as many as the number of rows of the organic electro luminescence arrays to supply with a negative voltage; and forming a plurality of first lines along the row direction non-array area located at an upper part of each row of the organic electro luminescence arrays to electrically connect the data pad, formed in each of the organic electro luminescence arrays, to the positive shorting bar, and forming a plurality of second lines along the row direction non-array area located at a lower part of each row of the organic electro luminescence arrays to electrically connect the scan pad, formed in each of the organic electro luminescence arrays, to the negative shorting bar.

The method further includes forming a first common line at the non-array area to be connected to the first line and to be commonly connected to each data pad, and forming a second common line connected to the second line and commonly connected to each scan pad.

The positive shorting bar, the second shorting bar, the first line and the second line are simultaneously patterned by one mask.

The positive shorting bar, the second shorting bar, the first line, the second line, the first common line and the second common line are simultaneously patterned by one mask.

BRIEF DESCRIPTION OF THE DRAWINGS

These and other objects of the invention will be apparent from the following detailed description of the embodiments of the present invention with reference to the accompanying drawings, in which:

FIGS. 11A to 11E are sectional views illustrating sequentially a method of fabricating the organic EL display device according to the first and the second embodiments of the present invention;

DETAILED DESCRIPTION OF THE PREFERRED EMBODIMENT

Reference will now be made in detail to the preferred embodiments of the present invention, examples of which are illustrated in the accompanying drawings.

Hereinafter, the preferred embodiments of the present invention will be described in detail with reference to FIGS. 5 to 15.

Figure 1:
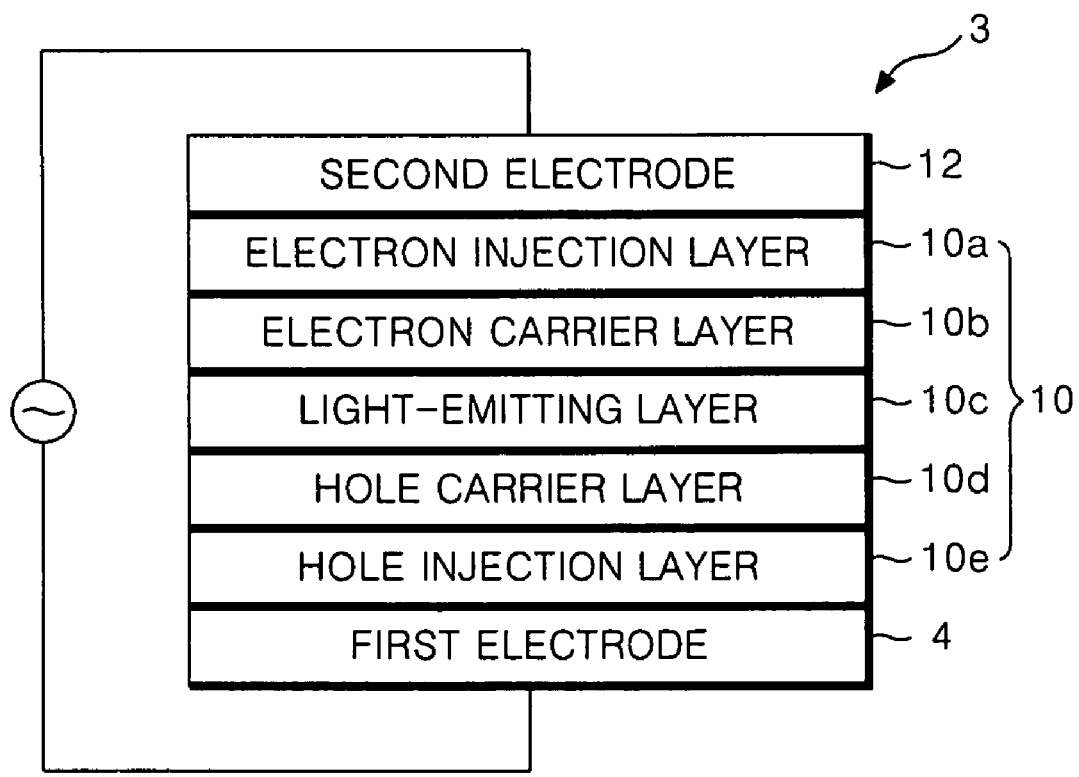
FIG. 1 is a sectional view illustrating an organic EL cell of a related art organic EL display device.
Figure 2:
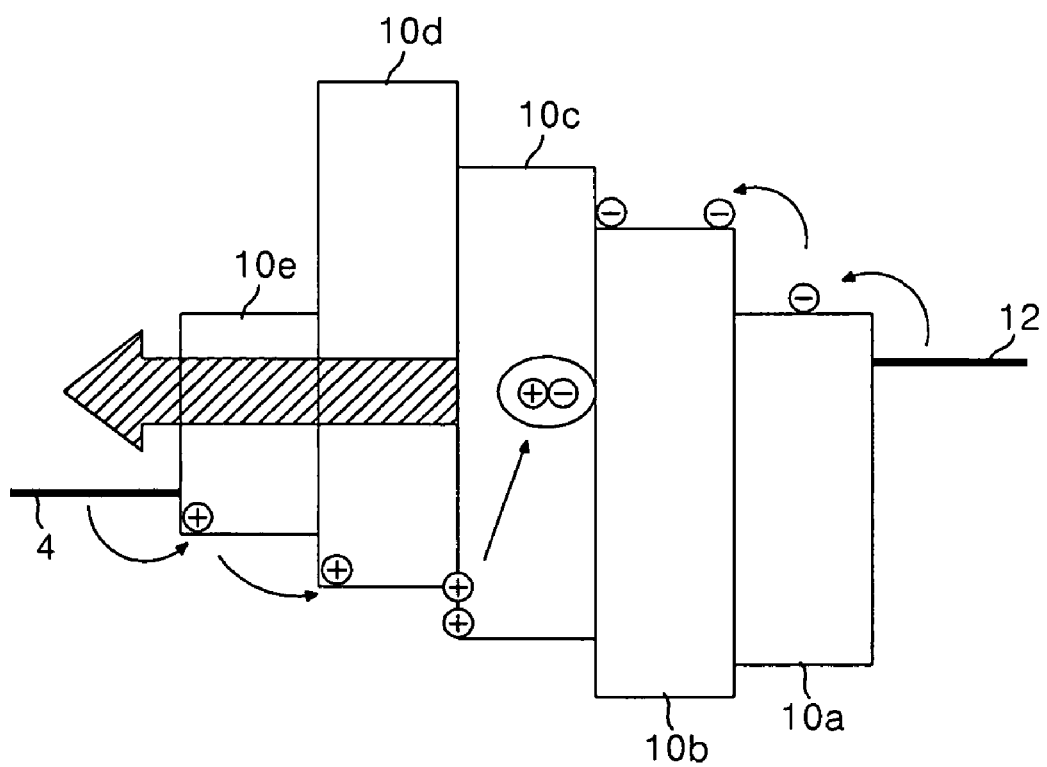
FIG. 2 is a diagram for explaining a light-emitting principle of the related art organic EL display device.
Figure 3:
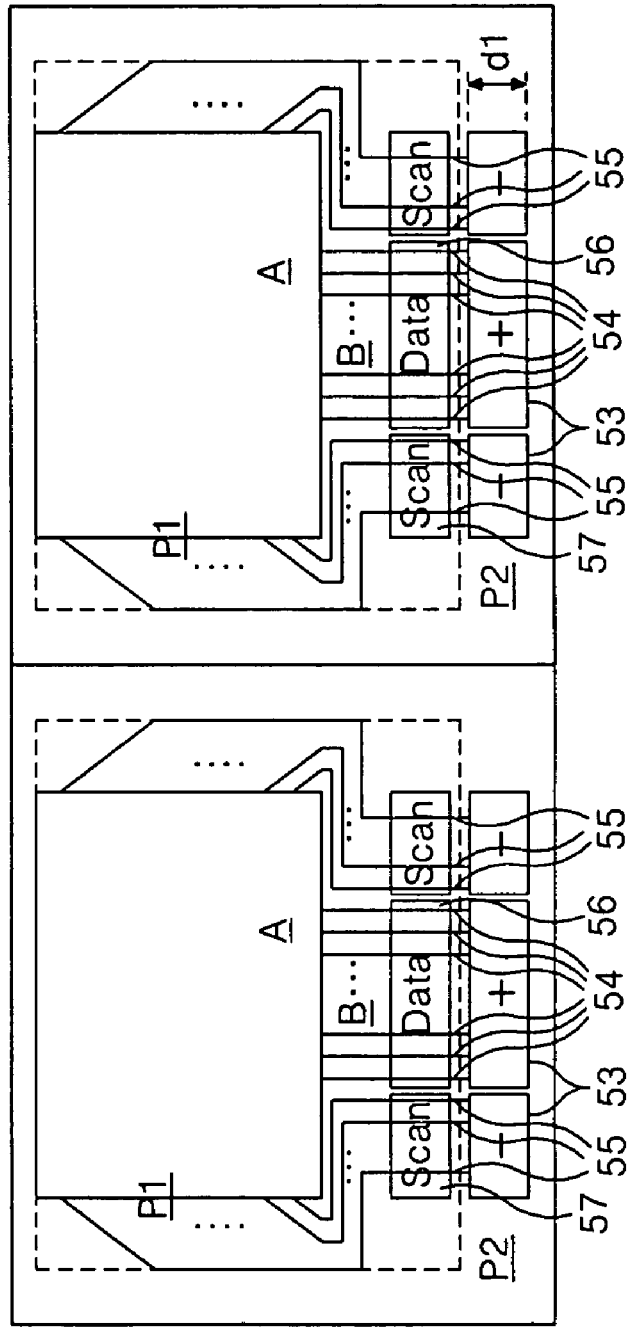
FIG. 3 is a view showing a mother glass having a plurality of organic EL arrays according to the related art.
Figure 4:
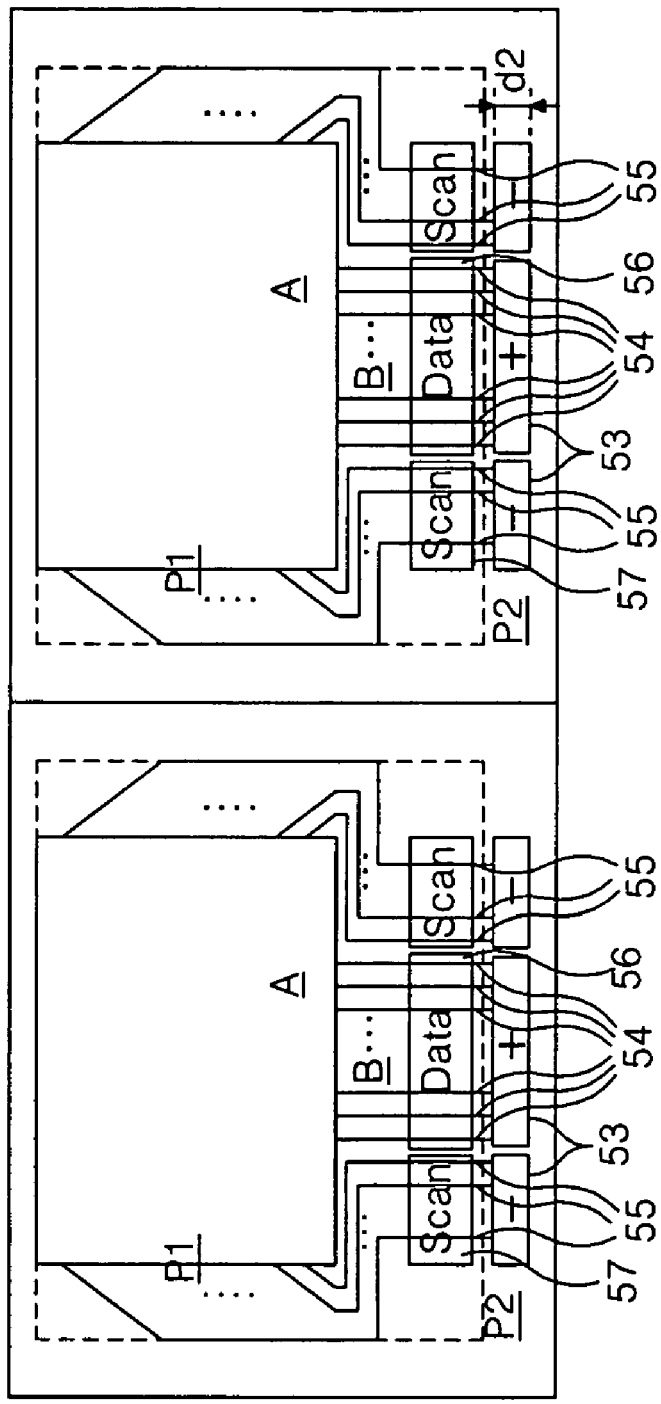
FIG. 4 is a view showing a mother glass having another plurality of organic EL arrays of the related art.
Figure 5:
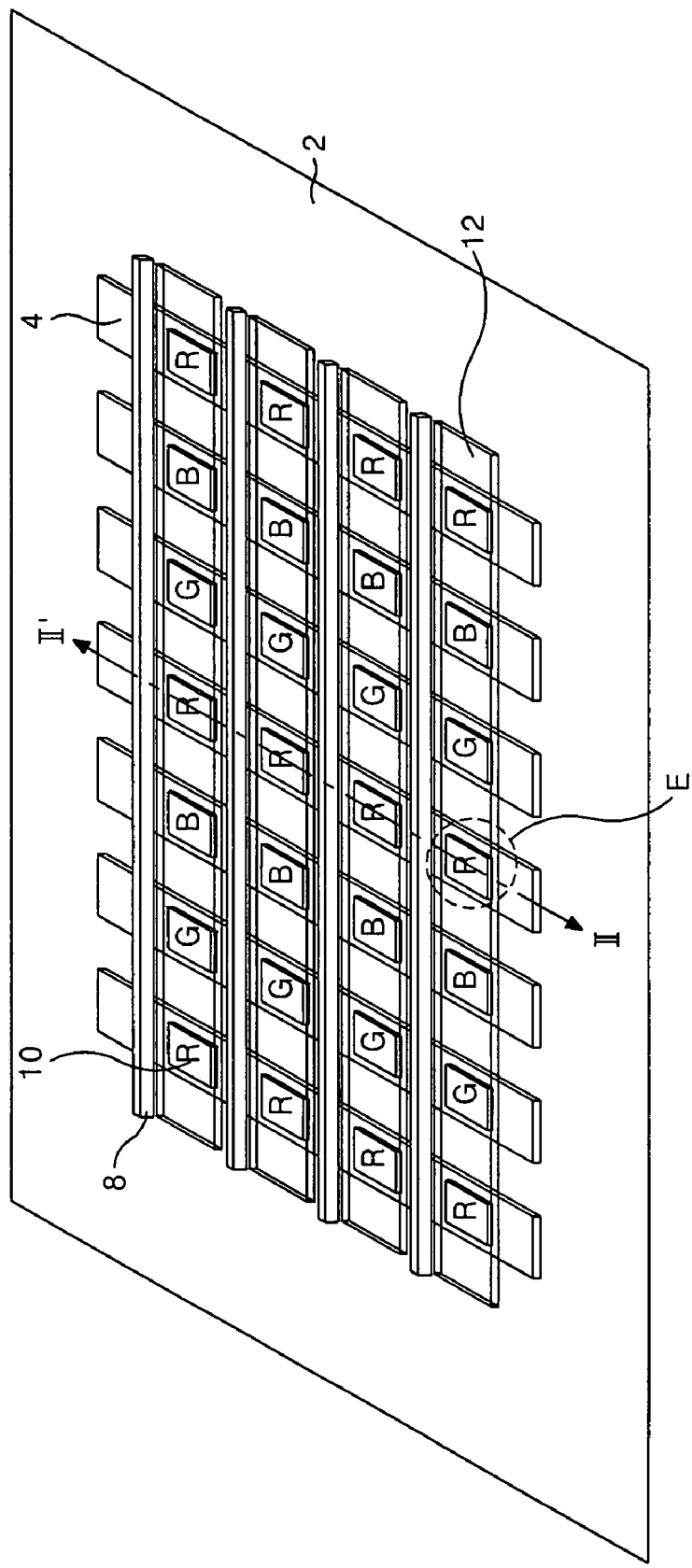
FIG. 5 is a schematic view showing an organic EL array of an organic EL display device according to the present invention.

FIG. 5 is a schematic view showing an organic EL array of an organic EL display device according to the present invention.

Referring to FIG. 5, the organic EL array of the organic EL display device has an anode electrode 4 and a cathode electrode 12 provided on a substrate 2 in a direction crossing each other.

A plurality of anode electrodes 4 are provided on the substrate 2 in such a manner to be spaced at a desired distance from each other. An insulating film (not shown) having an aperture for each EL cell (E) area is formed on the substrate 2 provided with the anode electrode 4. A barrier rib 8 for separating an organic light-emitting layer 10 and the cathode electrode 12 to be formed thereon is positioned on the insulating film. The barrier rib 8 is provided in a direction crossing the anode electrode 4 and has a reverse taper structure in which the upper portion thereof has a larger width than the lower portion thereof. The organic light-emitting layer 10 is deposited by using a mask to be formed on the insulating film having the barrier rib 8. And then, the cathode electrode 12 is entirely deposited to be formed on the substrate 2 having the organic light-emitting layer 10.

Figure 6:
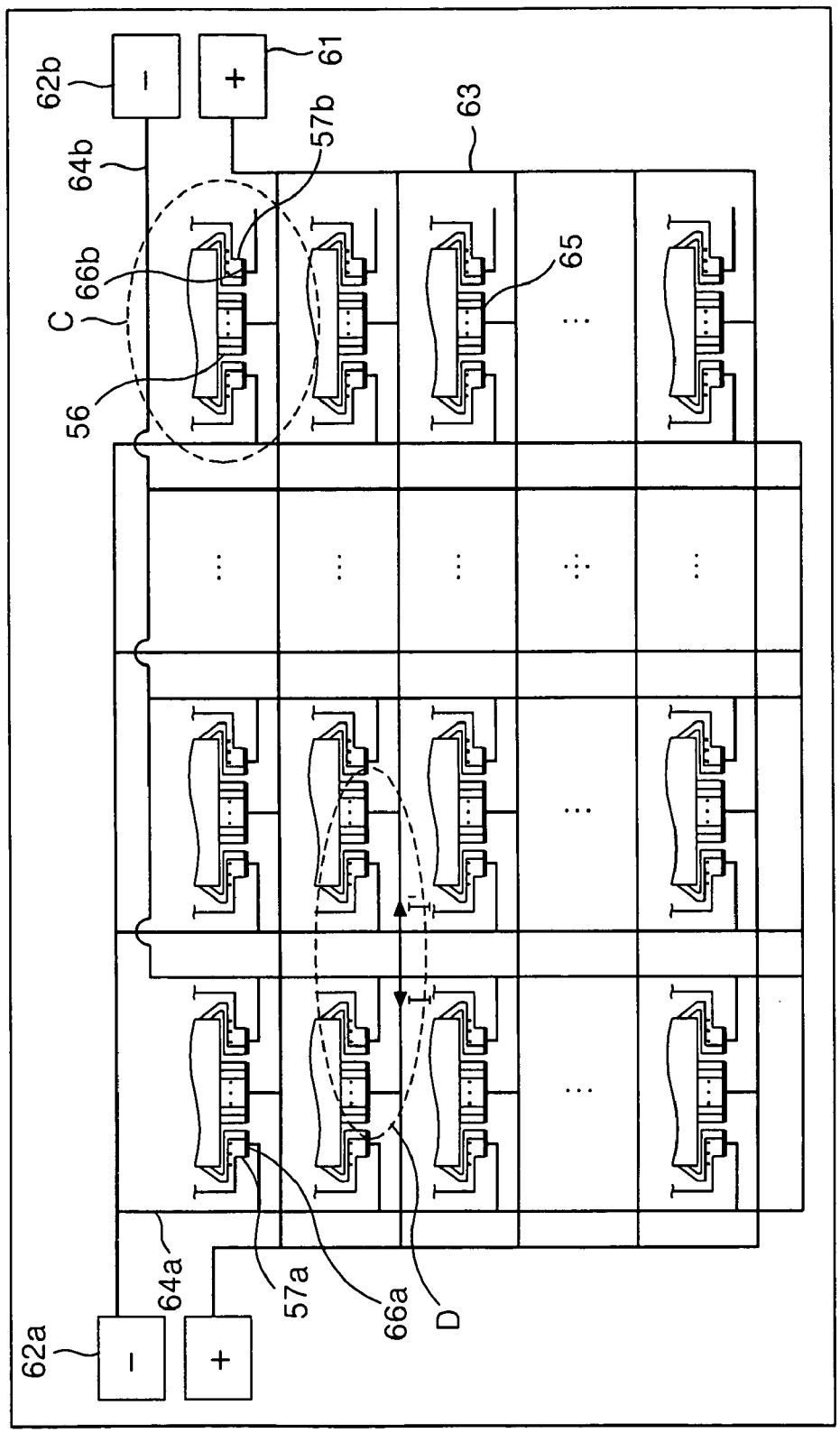
FIG. 6 is a view showing a mother glass having a plurality of organic EL arrays according to a first embodiment of present invention.
Figure 7:
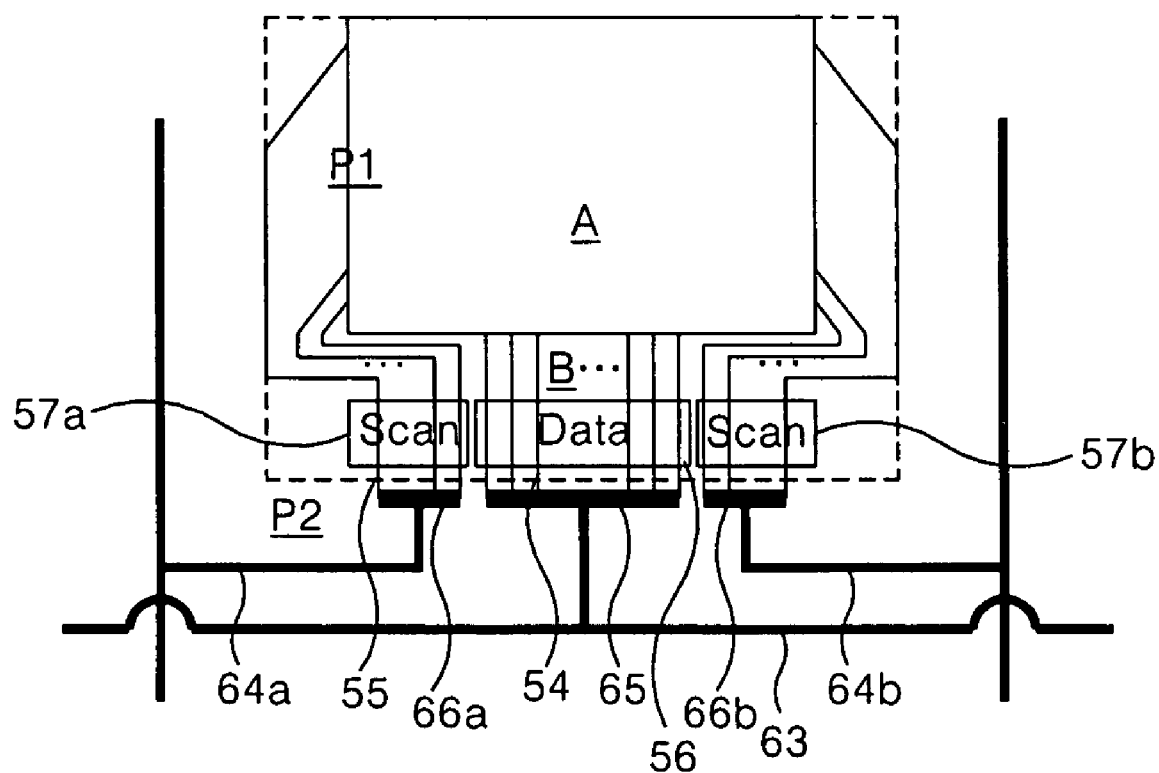
FIG. 7 is a detailed view showing a C area in FIG. 6.

FIG. 6 is a view showing a mother glass having a plurality of organic EL arrays according to a first embodiment of present invention, and FIG. 7 is a detailed view showing a C area in FIG. 6.

Referring to FIGS. 6 and 7, the mother glass is largely divided into an array area P1 where the organic EL array is located and a non-array area P2. The array area P1 includes a plurality of EL cells. The array area P1 includes a display area A where the organic EL array is formed to display a picture upon an organic light emission and a non-display area B where data lines 54 and scan lines 55, which extended from the organic EL array of the display area A, are located. The non-array area P2 includes a positive shorting bar 61 and negative shorting bars 62a and 62b, which are used to an aging process, this is, a stabilization process, and a lighting inspection for searching a defect, located at an upper edge area.

The non-array area P2 includes: a first line 63 for supplying a positive voltage from the positive shorting bar 61 to a data pad 56 of each organic EL array; and a first common line 65 for connecting the first line 63 to the data pad 56.

The non-array area P2 further includes: second lines 64a and 64b for supplying a negative voltage from the negative shorting bars 62a and 62b to the scan pad 57 of each organic EL array; and second common lines 66a and 66b for connecting the second lines 64a and 64b to the scan pad 57.

The positive shorting bar 61 located at the upper edge area of the non-array area P2 and the first common line 65 are connected each other through the first line 63. If a positive voltage from a needle pin of inspecting equipment upon an aging process and a lighting inspection is applied to the positive shorting bar 61, then the positive voltage is applied via the first line 63 to the first common line 65 connected to the data pad 56 of each array area P1.

If a negative voltage is applied to the negative shorting bar 62a upon an aging process and a lighting inspection, then the second line 64a, connecting the negative shoring bar 62a located at a left upper edge area of the mother glass to the second common line 66a, supplies the negative voltage to the second common line 66a connected to the scan pad 57a located at the left side of each array area P1.

Further, if a negative voltage is applied to the negative shorting bar 62a upon an aging process and a lighting inspection, then the second line 64b, connecting the negative shoring bar 62b located at a right upper edge area of the mother glass to the second common line 66b, supplies the negative voltage to the second common line 66b connected to the scan pad 57b located at the right side of each array area P1.

The first line 63 and the second lines 64a and 64B are formed to have a line width of 40 μm to 60 μm, and the first common line 65 and the second common lines 66a and 66b are formed to have a line width of 90 μm to 100 μm.

Accordingly, the present invention case can reduce the non-array area of the mother glass as compared to the related art case including the positive and negative shorting bar 53 for each organic EL device. Thus, a space capable of designing the organic EL array in the mother glass is enlarged, so that cost becomes reduced and productivity becomes improved.

In the related art, new inspecting equipment is needed to manufacture whenever an organic EL device having another size is suggested. However, in the present invention, when the positive shorting bar 61 and the negative shorting bars 62a and 62b are located at the upper edge area of the mother glass, the positive shorting bar 61 and the negative shorting bars 62a and 62b are maintained as they are located at the edge area of the mother glass and only first line 63, second lines 64a and 64b, first common line 65, and second common lines 66a and 66b are changed with respect to a size of the organic EL array even through a model of the organic EL array is differentiated. Accordingly, an aging process and a lighting inspection can be performed. Thus, it is possible to reduce a manufacturing cost.

Figure 8:
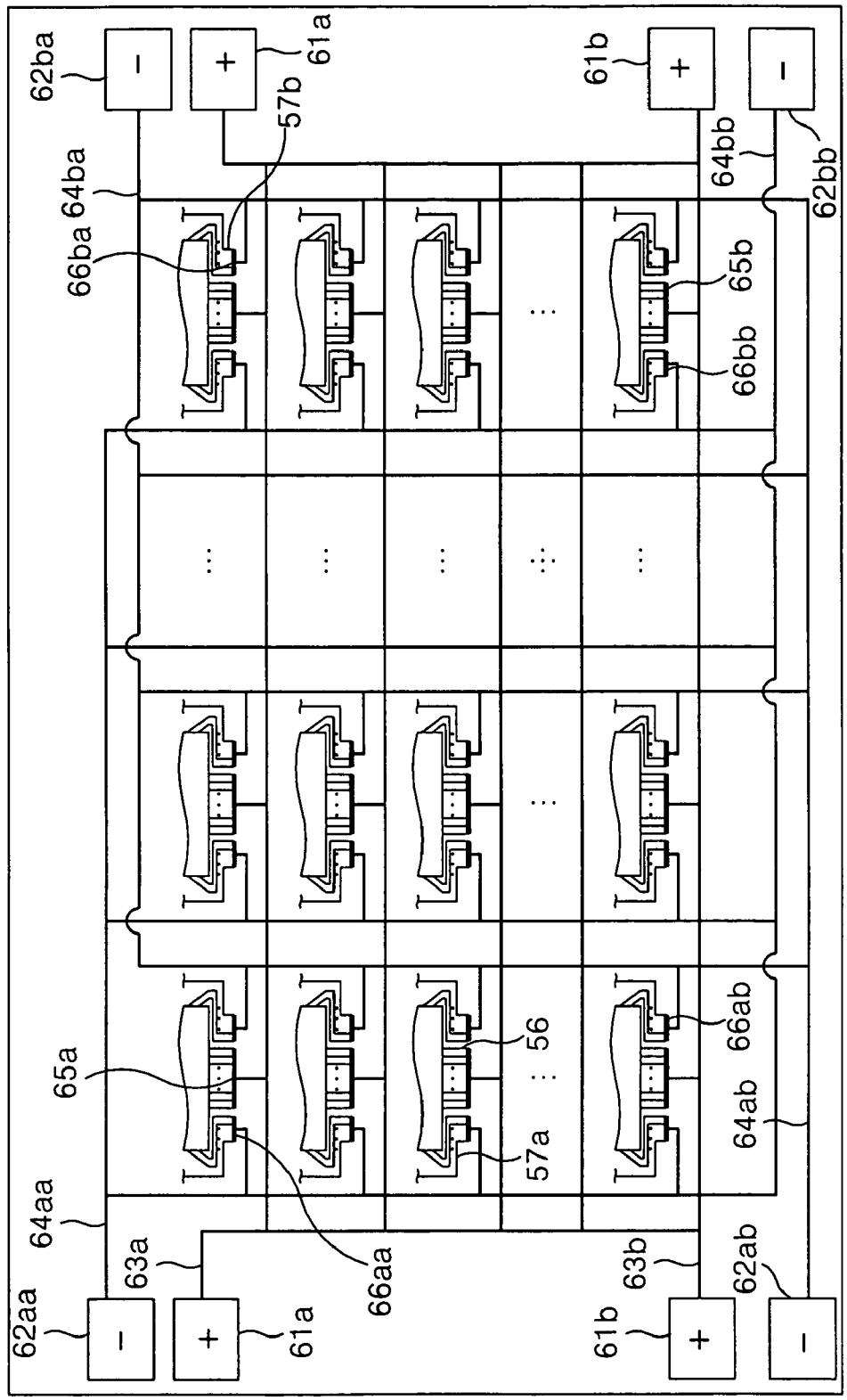
FIG. 8 is a view illustrating a mother glass having a plurality of organic EL arrays according to a second embodiment.

FIG. 8 is a view illustrating a mother glass having a plurality of organic EL arrays according to a second embodiment.

FIG. 8 is a view showing a positive shorting bar 61 and negative shorting bars 62a and 62b formed at upper and lower edge area of the mother glass differently from the positive shorting bar 61 and the negative shorting bars 62a and 62b located at the upper edge area of the mother glass of FIG. 6.

An entire data pad 56 of a plurality of organic EL arrays is connected to positive shorting bars 61a and 61b, which are located at the upper and lower edge area, through first lines 63a and 63b and first common lines 65a and 65b. If a positive voltage from a needle pin of inspecting equipment upon an aging process and a lighting inspection is applied to the positive shorting bars 61a and 61b, then the positive voltage is applied to the entire data pad 56 of the plurality of organic EL arrays through the first lines 63a and 63b and the first common lines 65a and 65b.

When a positive voltage is applied from a needle pin of inspecting equipment, the positive shorting bar 61a located at the upper edge area applies sequentially the positive voltage from the data pad 56 of upper first organic EL array to the data pad 56 of a (n/2)th organic EL array, and the positive shorting bar 61b located at the lower edge area applies sequentially the positive voltage from the data pad 56 of a nth organic EL array to the data pad 56 of the (n/2)th organic EL array.

Second lines 64aa and 64bb extended from a negative shorting bar 62aa located at an upper left edge area and a negative shorting bar 62bb located at a lower right edge area, and second common lines 66aa and 66bb are connected to a scan pad 57a located at a left side of the organic EL array.

Further, second lines 64ba and 64ab extended from a negative shorting bar 62ba located at the upper right edge area and a negative shorting bar 62ab located at the lower left edge area, and second common lines 66ba and 66ab are connected to a scan pad 57b located at a right side of the organic EL array.

The negative shorting bars 62aa and 62ba located at the upper edge area apply sequentially a negative voltage from the scan pad 57 of upper first organic EL array to the scan pad 57 of a (n/2)th organic EL array, and the negative shorting bars 62ab and 62bb located at the lower edge area apply sequentially the negative voltage from the scan pad 57 of a nth organic EL array to the scan pad 57 of the (n/2)th organic EL array.

When the negative shorting bars 62aa, 62ab, 62ba and 62bb are located at the upper and the lower parts to perform an aging process and a lighting inspection, a voltage drop of a scan line is prevented to secure a stabilization of the aging process and the lighting inspection.

As shown in a D area of FIG. 6, the first line 63 and the second line 64 are formed to be crossed each other.

Accordingly, an insulating film for preventing a phenomenon that the first line 63 and the second line 64 are shorted at a location where the first line 63 and the second line 64 cross each other.

Figure 9:
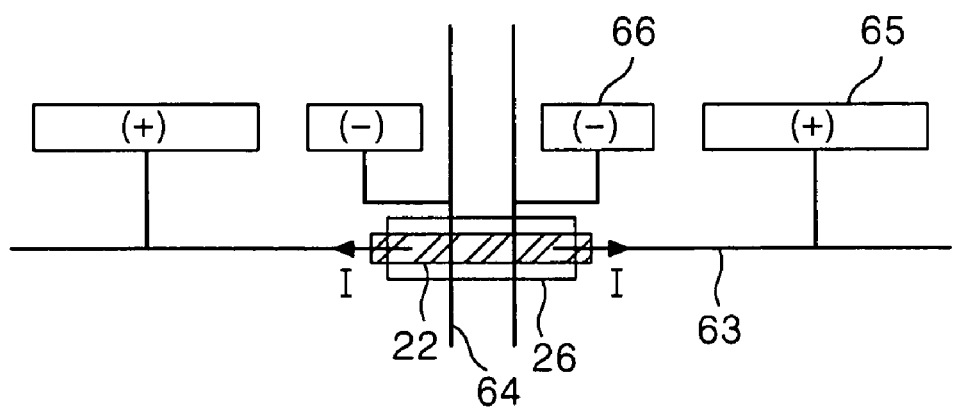
FIG. 9 is a detailed view showing a D area in FIG. 6.
Figure 10:
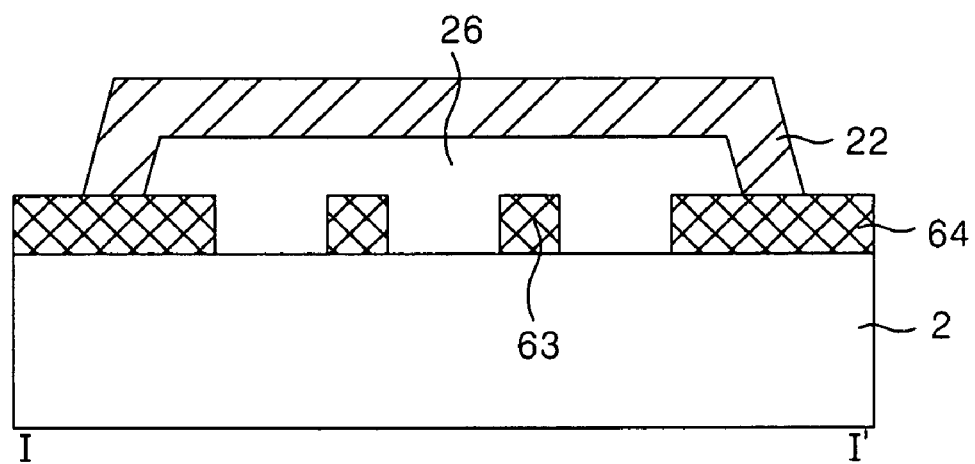
FIG. 10 is a sectional view illustrating the D area taken along the line I-I' in FIG. 6.

FIG. 9 is a detailed view showing a D area in FIG. 6, and FIG. 10 is a sectional view illustrating the D area taken along the line I-I' in FIG. 6.

As shown in FIGS. 9 and 10, the first line 63 is formed to be partially disconnected at the area crossing the second line 64, and a dummy insulating film 26 is formed between the first line 63 and the second line 64. On the dummy insulating film 26, a first metal pattern 22 for electrically connecting the disconnected first line is formed.

Accordingly, the first line 63 and the second line 64 are electrically separated from each other.

FIGS. 11A to 11E are sectional views illustrating sequentially a method of fabricating the organic EL display device according to the present invention.

Referring to FIGS. 11A to 11E, the description on the method of fabricating the organic EL display device is as follows.

FIGS. 11A to 11E are sectional views illustrating the organic EL display device taken along the line I-I' of the D area in FIG. 6 and the line II-II' in FIG. 5.

A transparent conductive metal material is deposited on a substrate 2 having an array area and a non-array area and is patterned by a photolithograph process and an etching process to thereby form an anode electrode 4 of the organic EL array (the line II-II') as shown in FIG. 11A and a data line and a scan line (not shown).

On the scan line of the substrate having the anode electrode 4, the data line and the scan line, a conductive metal layer is deposited and is patterned by a photolithography process and an etching process to thereby form a first line 63 and a second line 64 of the non-array area( the line I-I') as shown in FIG. 11B and a first common line and a second line (not shown). At this moment, a positive and negative shorting bar(not shown) is formed together at an upper edge area of the mother glass.

Figure 11C:
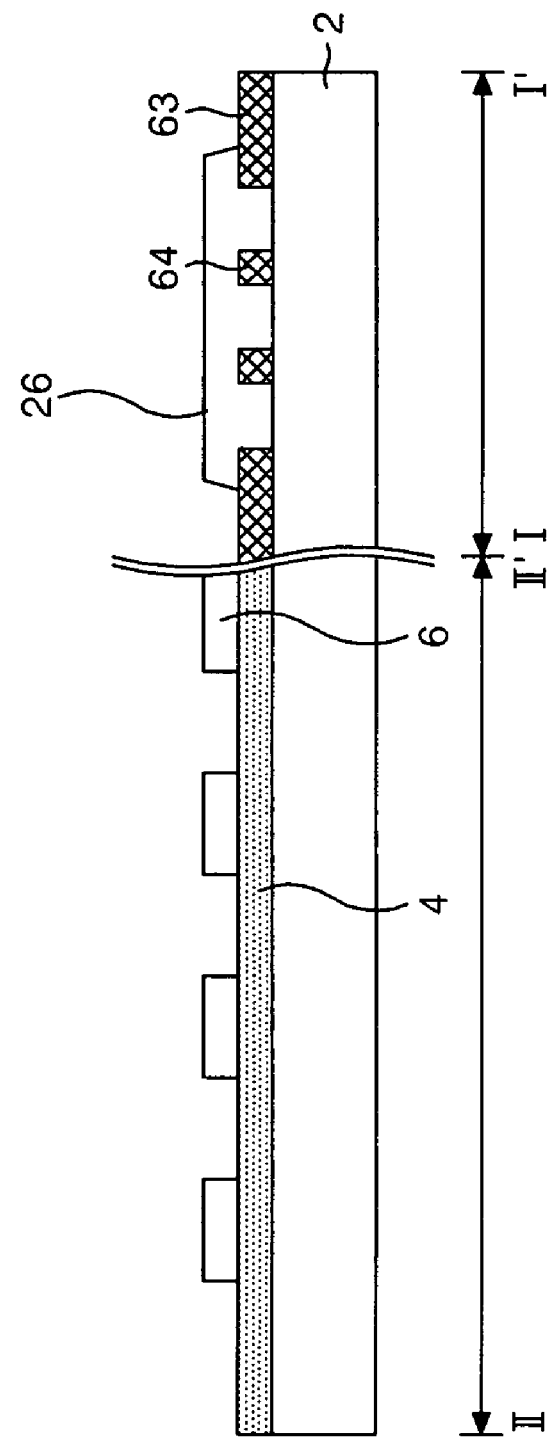

On the substrate 2 having an anode electrode 4, the data line and the scan line of an organic EL cell (the line II-II') and the first line 63 and the second line 64 of the non-array area (the line I-I'), a photosensitive insulation material is coated by a spin coating method and is patterned by a photolithography process to thereby an insulating film 6 and a dummy insulating film 26 as shown in FIG. 11C. Herein, the insulating film 6 is formed to expose a light-emitting area of the organic EL array (the line II-II'), and the dummy insulating film 26 is formed of the same material as the insulating film 6 of the organic EL array (the line II-II') at a cross of both the first line 63 and the second line 64 in the non-array area (the line I-I').

Figure 11D:
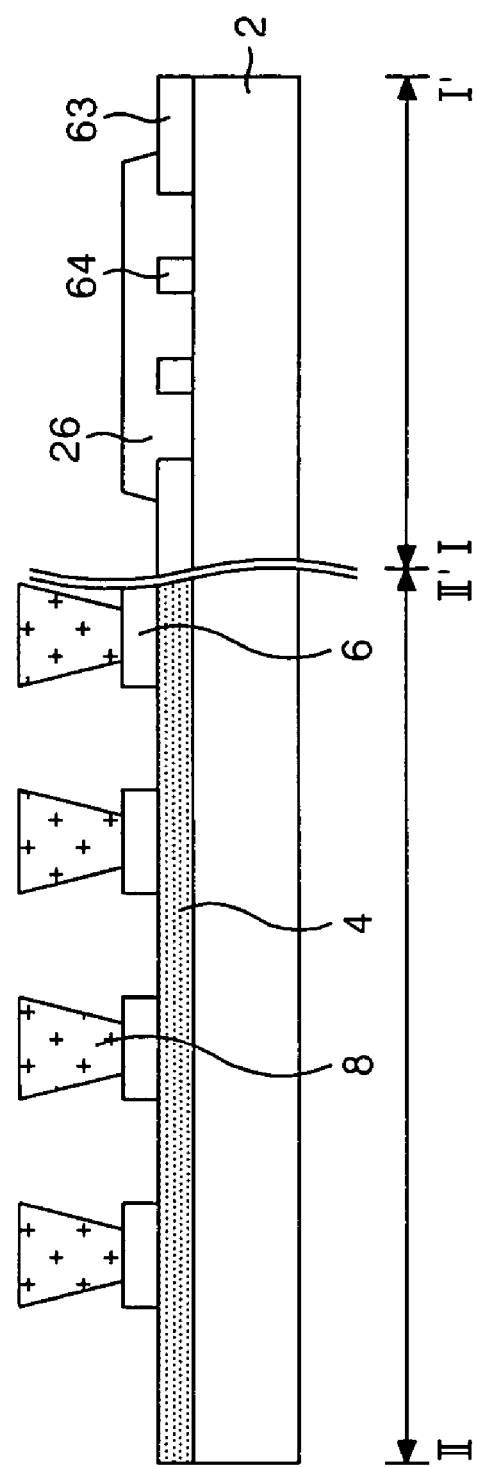
Figure 11E:
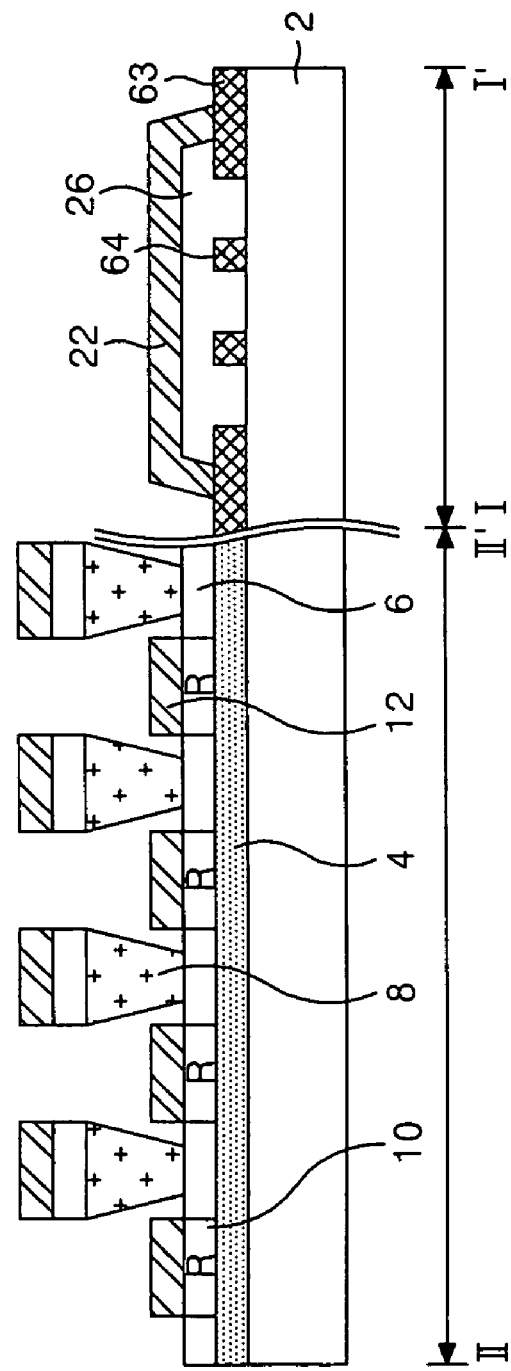

On the insulating film 6 of the organic EL cell (the line II-II), a photosensitive organic material is deposited and is patterned by a photolithography process to thereby form a barrier rib 8 as shown in FIG. 11D.

On the substrate 2 having the barrier rib 8, an organic light-emitting layer 10 is formed.

On an organic EL array of the substrate 2 having the organic light-emitting layer 10, a conductive material such as aluminum is deposited and is patterned by a photolithography process to thereby form a cathode electrode 12 of the organic EL array (the line II-II') and a first metal pattern 22. Herein, the metal pattern 22 is formed of the same material as the cathode electrode 12 of the organic EL array (the line II-II') and is for connecting the first line 63 of the non-array area (the line I-I'). Accordingly, the first line 63, not connected in the non-array area (the line I-I') is electrically connected.

As described above, the plurality organic EL arrays are formed on the mother glass, and the positive and the negative shorting bars and the plurality of lines for an aging inspection and a lighting inspection are formed. Thereafter, the needle pin of inspecting equipment is contacted with the positive and negative shorting bars to perform the aging inspection and the lighting inspection. The mother glass decided as a normal driving by the inspection process is divided into a plurality of organic EL display devices by a scribing process after performing an encapsulation process. Accordingly, the plurality of organic EL display devices is formed.

Meanwhile, the lines and the shorting bars of the non-array area of the mother glass are removed upon a scribing process.

In the mother glass and the method of fabricating the organic EL display device using the same, more than at least one shorting bar is formed at the edge area of the mother glass and the lines for connecting the each organic EL array to the shorting bars formed at the edge area of the mother glass are formed. Accordingly, the present invention relatively raises the array area of the mother glass as compared to that of the related art. Thus, it is possible to improve a productivity of the organic EL display device.

Further, the needle pin of inspecting equipment is connected to the shorting bars formed at the edge area of the mother glass, so that it is not required to designing a separate inspecting equipment for an inspecting process of the organic EL display device having another size in the mother glass is enlarged, so that cost becomes reduced.

In addition, it is possible to prevent a scratch cause on the pad by the needle pin of the inspecting equipment and to prevent a brightness difference upon a device lighting emission as compared to the related art.

Figure 12:
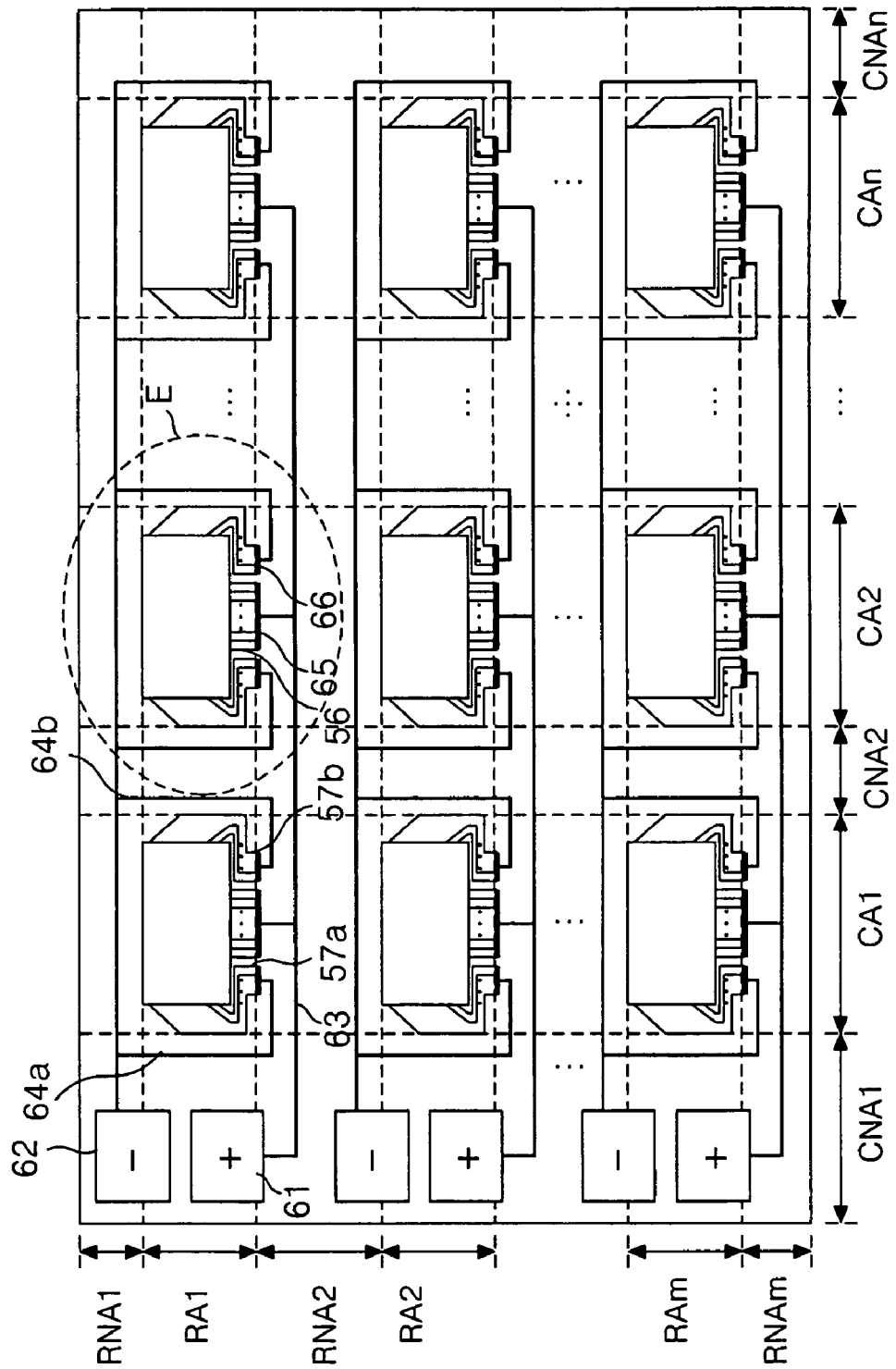
FIG. 12 is a view showing a mother glass having a plurality of organic EL arrays according to a third embodiment of the present invention.
Figure 13:
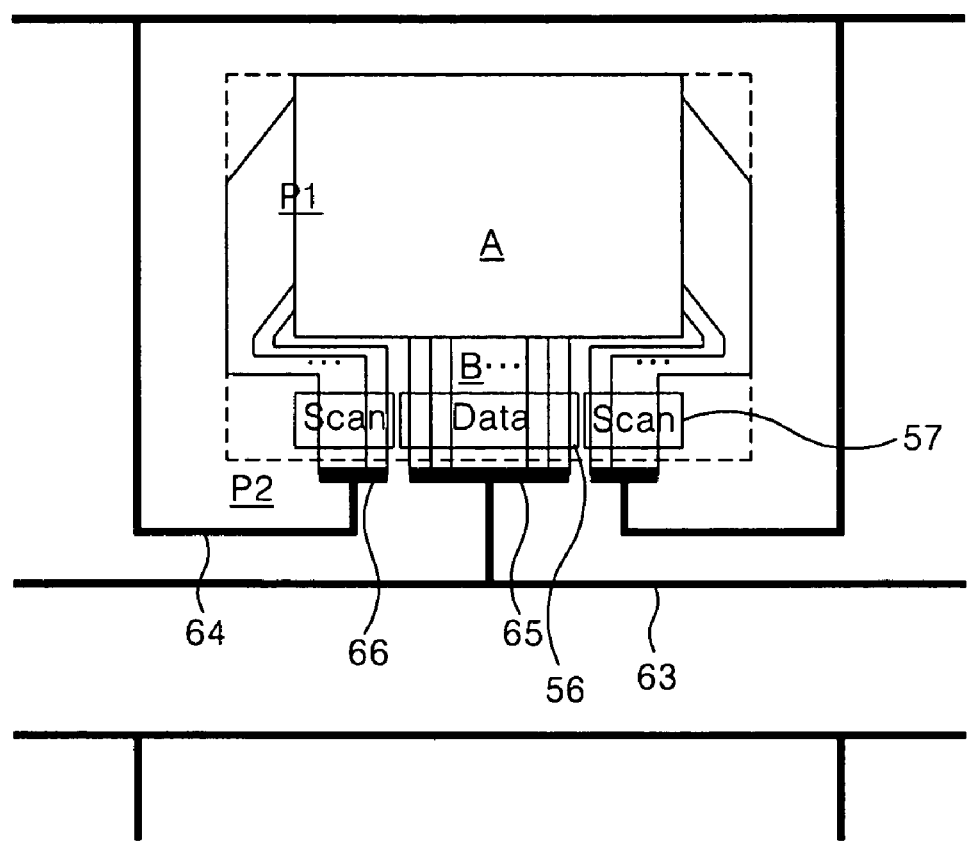
FIG. 13 is a enlarged view showing an E area of the mother glass in FIG. 12.

FIG. 12 is a view showing a mother glass having a plurality of organic EL arrays according to a third embodiment of the present invention, and FIG. 13 is a enlarged view showing an E area of the mother glass in FIG. 12.

Referring to FIGS. 12 and 13, the mother glass is largely divided into an array area P1 where the organic EL array is located and a non-array area P2. The array area P1 includes a display area A where the organic EL array is formed to display a picture upon an organic light emission and a non-display area B where data lines 54 and scan lines 55, which extended from the organic EL array of the display area A, are located.

In the non-array area P2, a row direction non-array area RNA1 to RNAn, arranged between the organic EL arrays forming row and column of adjacent row, and a column direction non-array area CNA1 to CNAn, arranged between the organic EL arrays of adjacent column, are located. Further, in the non-array area P2, the positive shorting bar 61 and the negative shorting bar 62 used to an aging process, that is, a stabilization process of the organic EL display device, and a lighting inspection searching a defect are formed at a left column direction non-array area CNA1 of the far left column arranged at a left side of organic EL arrays as many as the number of rows in the organic EL arrays.

In the non-array area P2, the positive shorting bar 61 of each row is arranged at the left column direction non-array area CNA1 of the mother glass as many as the number of rows in the organic EL arrays. Further, a first line 63, supplying a positive voltage from the positive shorting bar 61 to a data pad 56 corresponding to the organic EL arrays, is formed along the row direction non-array area RNA1 to RNAn located at the upper part of each row of the organic EL arrays. And, a first common line 65, connecting the first line 63 to the data pad 56 of the organic EL arrays of a corresponding row, is formed.

In the non-array area P2, the negative shorting bar 62 of each row is arranged at the left column direction non-array area CNA1 of the mother glass as many as the number of rows in the organic EL arrays. Further, a second line 64, supplying a negative voltage from the negative shorting bar 62 to a scan pad 57 corresponding to the organic EL arrays, is formed along the row direction non-array area RNA1 to RNAn located at the lower part of each row of the organic EL arrays. The second line 64 is extended from the row direction non-array area RNA1 to RNAn to be formed along the row direction array area CNA1 to CNAn. And, a second common line 66, connecting the second line 64 to the scan pad 57 of the organic EL arrays. In this case, a second line 64a formed along the column direction non-array area CNA1 to CNAn located at a left side of a corresponding organic EL array applies a negative voltage to the scan pad 57a located at a left side of the organic EL arrays of the corresponding row. And, a second line 64b formed along the column direction non-array area CNA1 to CNAn located at a right side of a corresponding organic EL array applies a negative voltage to the scan pad 57b located at a right side of the organic EL arrays of the corresponding row.

When a positive voltage is applied from a needle pin of inspecting equipment upon an aging process and a lighting inspection to the positive shorting bar 61, the first line 63 applies the positive voltage to the first common line 65 connected to the data pad 56 of the organic EL arrays of a corresponding row.

Further, When a negative voltage is applied from a needle pin of inspecting equipment upon an aging process and a lighting inspection to the negative shorting bar 62, the second line 64 applies the negative voltage to the second common line 66 connected to the scan pad 57 of the organic EL arrays of a corresponding row.

The first line 63 and the second line 64 are formed to have a line width of 40 μm to 60 μm, and the first common line 65 and the second common line 66 are formed to have a line width of 90 μm to 100 μm.

Accordingly, the present invention case can reduce the non-array area P2 of the mother glass as compared to the related art case including the positive and negative shorting bar 53 having the line width of more than 2000 μm for each organic EL device. Thus, a space capable of designing the organic EL array in the mother glass is enlarged, so that cost becomes reduced and productivity becomes improved.

Figure 14:
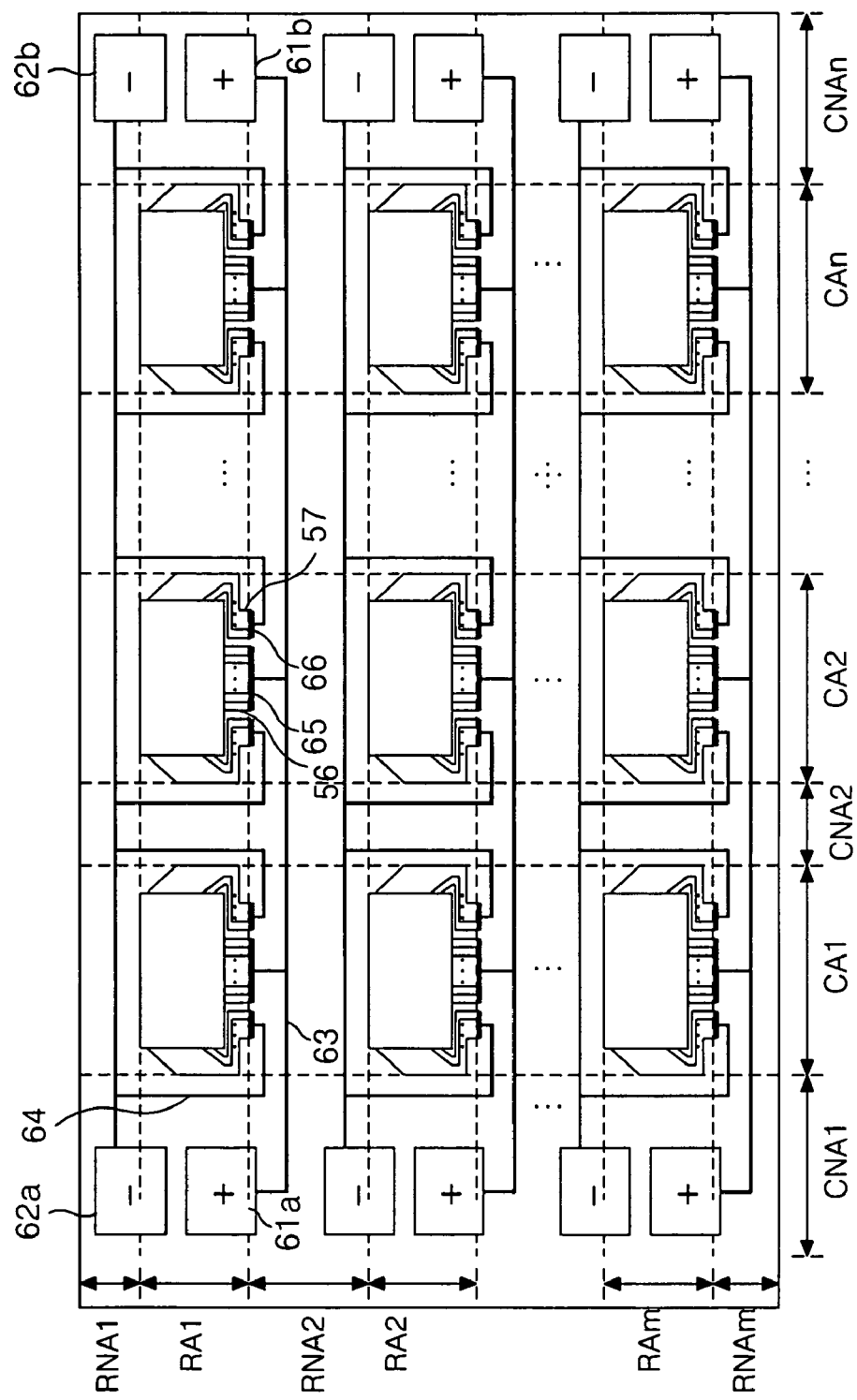
FIG. 14 is a view showing a mother glass having a plurality of organic EL arrays according to a fourth embodiment of the present invention.

FIG. 14 is a view showing a mother glass having a plurality of organic EL arrays according to a fourth embodiment of the present invention.

FIG. 14 is a view showing a positive shorting bar 61 and a negative shorting bar 62 located at a left column direction non-array area CNA1 and a right column direction non-array area CNAn of the mother glass.

A data pad 56 of entire organic EL arrays of each row is connected to positive shorting bars 61a and 61b located at the left column direction non-array area CNA1 and the right column direction non-array area CNAn of a corresponding row via the first line 63 and the first common line 65. If a positive voltage from a needle pin of inspecting equipment upon an aging process and a lighting inspection is applied to the positive shorting bars 61a and 61b of each row, then the positive voltage is applied to the data pad 56 of the entire organic EL arrays of the corresponding row via the first line 63 and the first common lines 65.

When a positive voltage is applied from a needle pin of inspecting equipment, the positive shorting bar 61a of each row located at the left column direction non-array area CNA1 applies sequentially the positive voltage from the data pad 56 of left first organic EL array of the corresponding row to the data pad 56 of a (n/2)th organic EL array, and the positive shorting bar 61b located at the right column direction non-array area CNAn of each row applies sequentially the positive voltage from the data pad 56 of a nth organic EL array of the corresponding row to the data pad 56 of the (n/2)th organic EL array.

When a negative voltage is applied from a needle pin of inspecting equipment, the negative shorting bar 62a of each row located at the left column direction non-array area CNA1 applies sequentially the negative voltage from the scan pad 57 of left first organic EL array of the corresponding row to the scan pad 57 of a (n/2)th organic EL array, and the negative shorting bar 62b located at the right column direction non-array area CNAn of each row applies sequentially the nega-tive voltage from the scan pad 57 of a nth organic EL array of the corresponding row to the scan pad 57 of the (n/2)th organic EL array.

When the negative shorting bars 62a and 62b are located at the left and the right sides to perform an aging process and a lighting inspection, a voltage drop of a scan line is prevented to secure a stabilization of the aging process and the lighting inspection.

Figure 15:
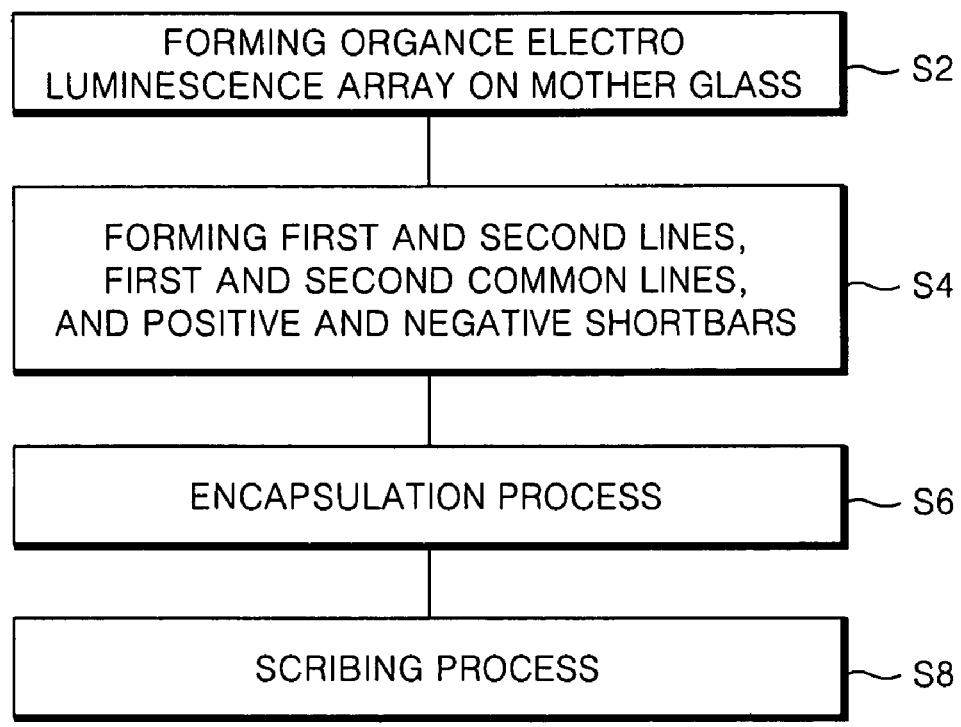
FIG. 15 is a flow chart showing a method of fabricating the organic EL display device according to the third and the fourth embodiments of the present invention.

FIG. 15 is a flow chart showing a method of fabricating the organic EL display device according to the third and the fourth embodiments of the present invention.

First of all, at a step 2 (S2), the organic EL array including the first and the second electrodes and the organic light-emitting layer is formed at the array area P1 of the mother glass.

At a step 4 (S4), at the non-array area P2 of the mother glass including the organic EL array, the first and the second lines 63 and 64, and the first and the second common lines 65 and 66 are formed to be integrated each other. Herein, the first and the second lines 63 and 64, and the first and the second common lines 65 and 66 are formed of a conductive material such as chrome Cr, molybdenum Mo, aluminum Al, silver Ag and the like. Further, the positive and the negative shorting bars 61 and 62 are formed at one side of the edge area of the mother glass.

Thereafter, the needle pin of inspecting equipment is contacted with the positive and the negative shorting bars 61 and 62 to perform an aging process and a lighting inspection. A voltage applied via the needle pin to the positive and the negative shorting bars 61 and 62 is supplied via the first and the second lines 63 and 64 and the first and the second common lines 65 and 66 to the data and the scan pads 56 and 57 of the organic EL arrays.

The mother glass decided as a normal driving by the inspection process is divided into a plurality of organic EL display devices by a scribing process at a step 8 (S8) after performing an encapsulation process at a step 6 (S6). Accordingly, the plurality of organic EL display devices is formed.

Meanwhile, the lines and the shorting bars of the non-array area P2 of the mother glass are removed upon a scribing process.

In the mother glass and the method of fabricating the organic EL display device using the same, the positive and the negative shorting bars corresponding to the organic EL display arrays of each row are formed at the edge area of the mother glass and the lines for electrically connecting the each organic EL array to the positive and the negative shorting bars formed at the edge area of the mother glass are formed. Accordingly, the present invention relatively raises the array area of the mother glass as compared to that of the related art. Thus, it is possible to improve a productivity of the organic EL display device.

In addition, the present invention is possible to prevent a scratch cause on the data and the scan pads by the needle pin of the inspecting equipment as compared to the related art. Thus, it is possible to prevent a brightness difference of the EL cell, in which a scratch is generated on the data pad or the scan pad by contacting with the needle pin upon a device lighting emission, and an EL cell, in which the scratch is not generated on the data pad or the scan pad.

As described above, in the mother glass and the method of fabricating the organic EL display device using the same, an aging inspection and a lighting inspection are performed by using the positive and the negative shorting bars, formed at the edge area of the non-array area in the mother glass, the first line and the first common line, connected to the positive shorting bar, and the second line and the second common line, connected the negative shorting bas. Accordingly, the non-array area of the mother glass cut by a scribing process can be reduced, so that a space capable of designing the organic EL array in the mother glass is enlarged. Thus, it is possible to reduce cost and to improve productivity.

Otherwise, it is possible to prevent a scratch capable of being generated by the needle pin of inspecting equipment upon an aging process and a lighting inspection.

Furthermore, new inspecting equipment for an aging process ad a lighting inspection is not needed to be designed whenever an organic EL device having another size is suggested, by locating the positive and the negative shorting bars at the edge area of the mother glass. Thus, it is possible to lower a manufacturing cost.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. A method of fabricating an organic electro luminescence display device, comprising:
   providing a mother glass including a plurality of organic electro luminescence arrays having a scan pad and a data pad, wherein the plurality of organic electro luminescence arrays are arranged in a matrix type, a non-array area, arranged between the organic electro luminescence arrays arranged in the matrix type, and an edge area located at an exterior of the arrangement of the matrix;
   forming at least more than one positive shorting bar at the edge area to supply with a positive voltage, and forming at least more than one negative shorting bar at the edge area to supply with a negative voltage; and
   forming a first line at the non-array area to electrically connect the data pad, formed in each of organic electro luminescence arrays, to the positive shorting bar, and forming a second line at the non-array area to electrically connect the scan pad, formed in each of organic electro luminescence arrays, to the negative shorting bar.

2. The method according to claim 1, further comprising forming a first common line connected to the first line and commonly connected to each data pad, and a second common line connected to the second line and commonly connected to each scan pad.

3. The method according to claim 1, further comprising:
   forming a dummy insulating film at a cross both the first line and the second line to electrically insulate the first line from the second line; and
   forming a first metal pattern on the dummy insulating film to electrically connect any one of the fist line and the second line.

4. The method according to claim 3, wherein the organic electro luminescence array includes:
   a first electrode;
   an insulating film partially exposing the first electrode to define a light-emitting area; and
   a second electrode formed at the light-emitting area, and
   wherein the dummy insulating film is simultaneously formed of the same material as the insulating film and the first metal pattern is simultaneously formed of the same material as the second electrode.

5. A method of fabricating an organic electro luminescence display device, using a mother glass including a plurality of organic electro luminescence arrays forming row and column and having a scan pad and data pad, and having a row direction non-array area arranged between the organic electro luminescence arrays of an adjacent row, a column direction non-array area arranged between the organic electro luminescence arrays of an adjacent column, a left column direction non-array area arranged at a left side of the organic electro luminescence arrays of the far left column and a right column direction non-array area arranged at a right side of the organic electro luminescence arrays of the far right column, comprising:
   forming a plurality of positive shorting bars in at least one area of the left non-array area and the right non-array area as many as the number of rows of the organic electro luminescence arrays to supply with a positive voltage;
   forming a plurality of negative shorting bars in at least one area of the left non-array area and the right non-array area as many as the number of rows of the organic electro luminescence arrays to supply with a negative voltage; and
   forming a plurality of first lines along the row direction non-array area located at an upper part of each row of the organic electro luminescence arrays to electrically connect the data pad, formed in each of the organic electro luminescence arrays, to the positive shorting bar, and forming a plurality of second lines along the row direction non-array area located at a lower part of each row of the organic electro luminescence arrays to electrically connect the scan pad, formed in each of the organic electro luminescence arrays, to the negative shorting bar.

6. The method according to claim 5, further comprising forming a first common line at the non-array area to be connected to the first line and to be commonly connected to each data pad, and forming a second common line connected to the second line and commonly connected to each scan pad.

7. The method according to claim 1 or claim 5, wherein the positive shorting bar, the second shorting bar, the first line and the second line are simultaneously patterned by one mask.

8. The method according to claim 2 or claim 6, wherein the positive shorting bar, the second shorting bar, the first line, the second line, the first common line and the second common line are simultaneously patterned by one mask.

* * * * *